(12) United States Patent
Hao et al.

(10) Patent No.: US 10,539,887 B2
(45) Date of Patent: Jan. 21, 2020

(54) LENS CONTAMINATION PREVENTION DEVICE AND METHOD

(71) Applicant: SHANGHAI MICRO ELECTRONICS EQUIPMENT (GROUP) CO., LTD., Shanghai (CN)

(72) Inventors: Baotong Hao, Shanghai (CN); Dongchun Lang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/329,496

(22) PCT Filed: Aug. 29, 2017

(86) PCT No.: PCT/CN2017/099513
§ 371 (c)(1),
(2) Date: Feb. 28, 2019

(87) PCT Pub. No.: WO2018/041099
PCT Pub. Date: Mar. 8, 2018

(65) Prior Publication Data
US 2019/0187561 A1 Jun. 20, 2019

(30) Foreign Application Priority Data
Aug. 30, 2016 (CN) .......................... 2016 1 0767140

(51) Int. Cl.
*G03F 7/20* (2006.01)
*G02B 27/00* (2006.01)
*G03F 9/00* (2006.01)

(52) U.S. Cl.
CPC ..... *G03F 7/70983* (2013.01); *G02B 27/0006* (2013.01); *G03F 7/20* (2013.01);
(Continued)

(58) Field of Classification Search
CPC ............. G02B 27/0006; G03F 7/70908; G03F 7/70916; G03F 7/70933; G03F 7/70983
See application file for complete search history.

(56) References Cited

U.S. PATENT DOCUMENTS

| 2001/0048510 | A1 | 12/2001 | Ahn et al. |
| 2002/0000519 | A1 | 1/2002 | Tsukamoto |
| 2006/0243927 | A1* | 11/2006 | Tran .................... G03F 7/70033 250/504 R |

FOREIGN PATENT DOCUMENTS

| CN | 101034261 A | 9/2007 |
| CN | 202837812 U | 3/2013 |

* cited by examiner

*Primary Examiner* — Michelle M Iacoletti
(74) *Attorney, Agent, or Firm* — Muncy, Geissler, Olds & Lowe, P.C.

(57) ABSTRACT

A lens anti-contamination device is disclosed, including a first device (300) and a second device (400) connected to the first device (300), the first device (300) being closer to a lens (100) relative to the second device (400), wherein the first device (300) is used to output protective layer gas, and the protective layer gas is enabled to uniformly flow in close contact with the lower surface of the lens (100) through a nozzle (330), such that the contaminated lens (100) can be cleaned and a protective layer is funned to prevent the lens from being contaminated again; the second device (400) is used to take away gas close to a contamination source, and the contamination gas enters an annular cavity (420) through small holes (410) and is exhausted into a distant environment through the suction and exhaust power of an exhaust passage (200). A lens anti-contamination method is also disclosed. Before exposure, the first device (300) is turned on and then the second device (400) is turned on; and after 12 hours after exposure, the second device (400) may be turned off. This device and method can better solve the problem that organic matters in photoresist are volatilized (Continued)

and contaminate the lens, it is simple to mount, the service life is long, the cost is low, the reliability is high, and it guarantees that contaminants are fully removed without entering the object lens.

10 Claims, 3 Drawing Sheets

(52) U.S. Cl.
CPC ...... *G03F 7/70908* (2013.01); *G03F 7/70916* (2013.01); *G03F 7/70933* (2013.01); *G03F 9/7057* (2013.01); *G03F 7/70925* (2013.01)

LENS CONTAMINATION PREVENTION DEVICE AND METHOD

TECHNICAL FIELD

The invention relates to the field of optical technology, and in particular to a lens anti-contamination device and method.

BACKGROUND

Lithography is a very important process in semiconductor manufacturing. It is a process of transferring a series of chip patterns on a mask to a corresponding layer of a silicon wafer through exposure. It is considered as the core step in the large-scale manufacture of integrated circuits. A series of complex and time-consuming lithography processes in semiconductor manufacturing are mainly accomplished by corresponding lithography machines.

In the process of exposure of the lithography machine, the organic solvent in the photoresist on the silicon wafer surface will be volatilized slowly after being heated, and the volatilized organic matter will adhere to the lens on the lower surface of the object lens. The adhesive matter directly affects the light transmittance in the object lens, and then affects the imaging quality of the product. Because the last lens on the lower surface of the object lens is very close to the surface of the silicon wafer, volatilized organic matter will easily adhere to the surface of the lens.

As illustrated in FIG. 1, the existing lithography machines mostly use the method of mounting an object lens protective film 102 on the lens base 101 of the lower surface of the object lens to prevent the organic matter from contaminating the lens. However, the protective film based anti-contamination device and method still have many shortcomings. Firstly, the normal service life of the protective film is determined by the energy of the transmitted light. Even in normal use, under the irradiation of 365 nm and 436 nm ultraviolet light, the service life of the protective film can only withstand the energy of 500000 J/cm$^2$, and the replacement frequency is once per one to two months. Secondly, the price of the protective film is very high. By calculating according to the price of each protective film which is CNY 1500, the normal loss is CNY 9000-18000 per year. Frequent replacement increases the use cost. In addition, because the distance between the surface of the silicon wafer and the lower surface of the object lens is only 40 mm, it is difficult to replace the protective film, which is easy to burst in the process of replacement; in addition, because the thickness of the film is very small, the change of external pressure will also cause the rupture of the protective film, the abnormal damage rate is up to 15% at present. If the protective film is broken inadvertently in the process of use, it will cause contamination of the lens which is conducting imaging process, and in serious cases, the imaging process fails. More importantly, it has been proved that, due to the limitation of the mounting structure, the protective film cannot completely prevent the organic matter volatilized from the photoresist from contaminating the lens; even, because the protective film cannot completely guarantee that the volatilized organic matter is removed, there may be contaminated parts in the whole lithography machine, such as the lens inside the object lens cavity, the upper surface lens, the surface of the silicon lens and the mask, which have requirements on cleanness. Because the lithography machine is high-precision equipment, more serious losses will be caused to users.

Therefore, a device and/or method for better preventing organic matters in photoresist from being volatilized and contaminating lenses are needed.

SUMMARY OF THE INVENTION

The purpose of the present invention is to provide a lens anti-contamination device and method to better solve the problems that contamination is not adequately controlled and the internal portion of the object lens cavity is contaminated.

In order to solve the above-mentioned technical problems, the present invention provides an anti-contamination device for a lens. The anti-contamination device for a lens includes a first device and a second device connected to the first device, the first device being closer to the lens relative to the second device, wherein the first device is configured to output a protective layer gas to form a gas curtain protective layer on a surface of the lens; and the second device is configured to suck and exhaust the protective layer gas and/or a contamination gas.

Alternatively in the lens anti-contamination device, the lens anti-contamination device further includes an exhaust passage, and the first device and the second device are each connected to the exhaust passage.

Alternatively, in the anti-contamination device for a lens, the exhaust passage is connected with a suction and exhaust power.

Alternatively in the lens anti-contamination device, the protective layer gas is a gas with a purity up to or higher than 99.999%.

Alternatively in the anti-contamination device for a lens, the first device includes a closed container.

Alternatively, in the anti-contamination device for a lens, the closed container is provided with a gas inlet and a nozzle, and the protective layer gas enters the closed container through the gas inlet and is output through the nozzle.

Alternatively in the anti-contamination device for a lens, the second device includes an annular cavity.

Alternatively, in the anti-contamination device for a lens, the lower surface of the annular cavity is provided with a plurality of small holes.

Alternatively in the anti-contamination device for a lens, distances between the small holes are equal.

The present invention further provides an anti-contamination method for a lens, including the following steps:

step 1: outputting a protective layer gas from a position close to the lower surface of the lens, such that a gas curtain protective layer is formed on a surface of the lens; and step 2: sucking the protective layer gas and/or a contamination gas from a position close to a contamination source, and exhausting the protective layer gas and/or the contamination gas into an environment away from the lens.

Alternatively, in the anti-contamination method for a lens, the lens is a lens of a lithography machine, and in step 1, the output of the protective layer gas is continuously performed before and after exposure of the lithography machine.

Alternatively in the anti-contamination method for a lens, the lens is a lens of a lithography machine, and in step 2, the suction and exhaust of the protective layer gas and/or the contamination gas are continuously performed during and after exposure of the lithography machine.

In the lens anti-contamination device and method provided by the present invention, the protective layer gas is output by the first device close to the lens to form the protective layer to prevent the lens from being contaminated; and further, the protective layer gas can also take away contaminants from the contaminated lens. By means of the second device far away from the lens, the gas close to the contamination source is taken away, such that the contaminants can be exhausted directly into the external environment far away from the lens; further, the precise parts of the lithography machine system can be protected; and during exposure of the lithography machine, two gas passages are opened, which can realize double guarantee and high reliability.

Figure 1:
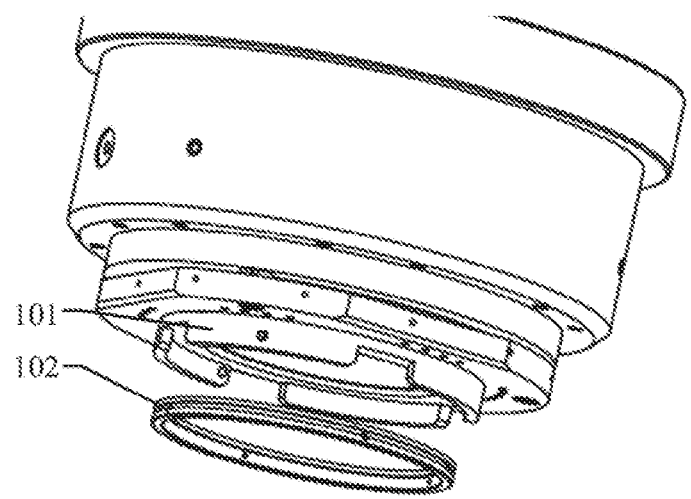
FIG. 1 is an existing lens anti-contamination protective film.

Herein, reference signs in FIGS. 1 to 6 are described as follows:

100—lens; 101—lens seat; 102—protective film; 200—exhaust passage; 300—first device; 310—gas inlet; 320—closed container; 330—nozzle; 400—second device; 410—small holes; 420—annular cavity; 500—silicon wafer; 600—partition plate.

DETAILED DESCRIPTION

The core idea of the present invention is to provide a lens anti-contamination device and method to solve the problems that it is greatly difficult to use the existing protective film, the cost is high, the protective film is easily ruptured, the contamination is not adequately controlled and the internal portion of the object lens cavity is contaminated. The present invention is different from the contamination protection device and method in the existing technology. By using the gas circulation device, the contaminant is isolated from the lens and the contaminant is directly taken away from the contamination source from the components of the object lens, so as to better solve lens contamination. The lens anti-contamination device and method provided by the present invention not only can be used to prevent the lower surface lens of the object lens from being contaminated, but also can be used to protect the parts that may be contaminated in the whole lithography machine, such as the inner lens of the object lens, the alignment lens, the upper surface lens, the surface of the silicon wafer and the surface of the mask which have requirements on cleanness. Although only the anti-contamination device and method for the lower surface lens of the object lens are described in the description of the present invention, one skilled in the art can easily understand that the desired device and method may be extracted from the technical solution of the present invention and combined to achieve the same technical effect.

In order to realize the above-mentioned idea, the present invention provides a lens anti-contamination device and method. The lens anti-contamination device includes a first device for outputting protective layer gas and a second device for taking away gas close to a contamination source; and the lens anti-contamination method achieves the technical effect of lens anti-contamination by outputting the protective layer gas from a position close to the lower surface of the lens, sucking gas from a position close to the contamination source, and exhausting the gas into the environment far away from the lens.

The lens anti-contamination device and method provided by the present invention will be further described below with reference to the drawings in combination with the specific embodiments. The advantages and features of the present invention will be clearer according to the following description and the claims. It should be noted that the drawings are in a very simplified form and use inaccurate scales only to conveniently and clearly describe the purposes of the embodiments of the present invention.

The lens anti-contamination device of the present invention is basically arranged between a silicon wafer and an object lens. For convenience of description, the "top" or "above" hereinafter denotes the side close to the object lens along the axis of the lens; the "bottom" or "below" denotes the side close to the silicon wafer along the axis of the lens; the "inner side" or "inner" denotes the side close to the center of the lens along the radial direction of the lens; and the "outer side" or "outer" denotes the side far away from the center of the lens along the radial direction of the lens.

Embodiment 1

Figure 2:
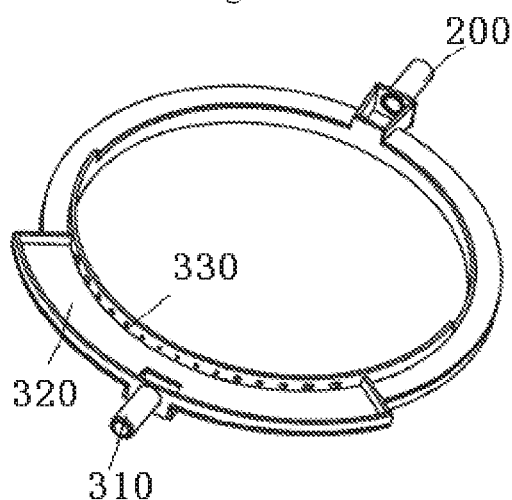
FIG. 2 is a schematic view of a first device in embodiment 1 of the present invention.
Figure 3:
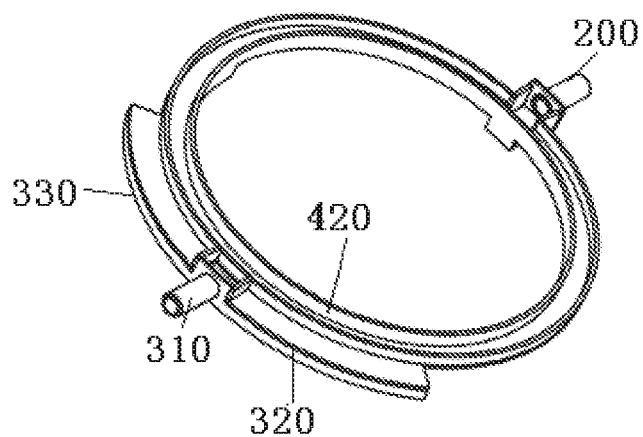
FIG. 3 is a sectional schematic view of a second device in embodiment 1 of the present invention.
Figure 4:
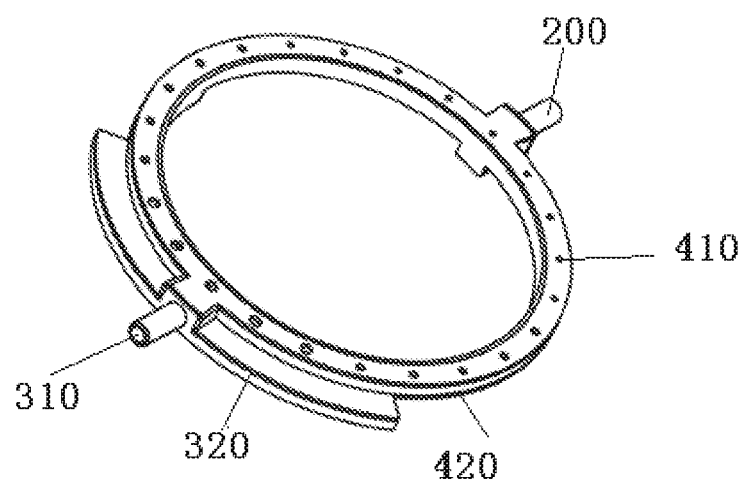
FIG. 4 is a schematic view of a second device in embodiment 1 of the present invention.

As illustrated in FIGS. 2, 3 and 4, the present embodiment discloses a lens anti-contamination device. The lens may be a lens of an object lens of a lithography machine or a lens of other optical devices such as a microscope. The contaminants may be organic matters volatilized from photoresist, which may be air impurities such as water vapor, dust and floating microorganisms that affect the light transmittance.

Figure 6:
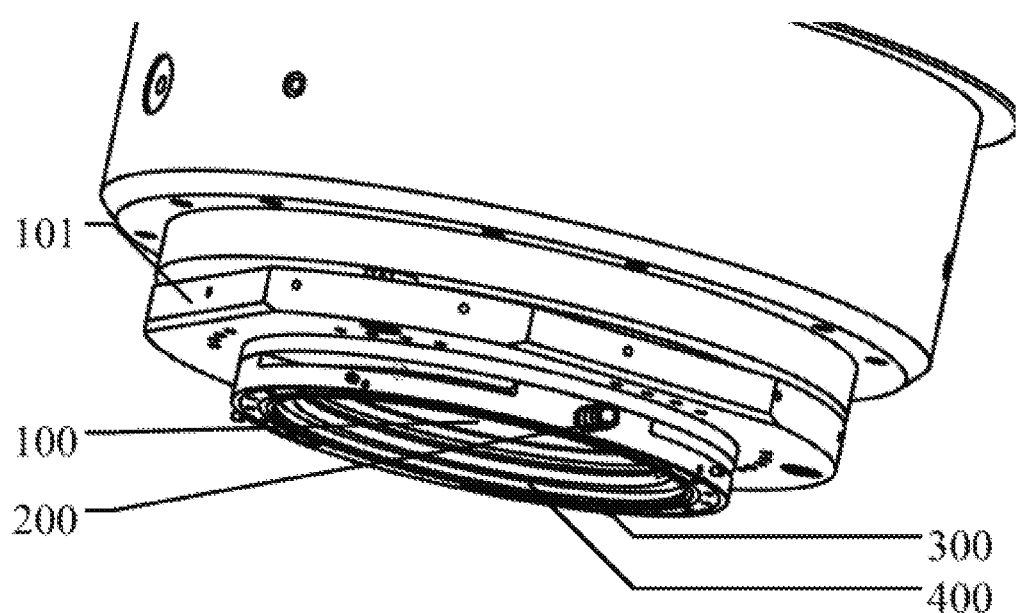
FIG. 6 is an assembly schematic view of a first device, a second device and a lens in the present invention.

Referring to FIG. 6, the lens anti-contamination device disclosed by the present embodiment includes a first device 300 and a second device 400 connected with the first device. The first device 300 is close to a lens 100, and the second device 400 is far away from the lens 100, wherein the first device 300 outputs protective layer gas to form a gas curtain protective layer on the surface of the lens, clean the contaminated lens and enable the gas to form a protective layer to prevent the lens from being contaminated again. The second device 400 is used to suck and exhaust the above-mentioned protective layer gas and/or contamination gas and to take away the gas close to a contamination source from the lens. The gas protective layer may be gas with purity reaching certain requirements, which reaches at least 99.999%, such as high-purity nitrogen or other high-purity gas.

The lens anti-contamination device disclosed by the present embodiment further includes an exhaust passage 200, and the first device 300 and the second device 400 are respectively connected with the exhaust passage 200. The exhaust passage 200 is provided with suction and exhaust power. The exhaust passage 200 is used to suck and exhaust gas entering the first device 300 from the external environment or gas originally in the first device 300, and gas entering the second device 400 from the external environment or gas originally in the second device 400. The sucking and exhaust power at the exhaust passage 200 is preferably enough to allow the gas in the first device 300 and/or the second device 400 to enter and flow through the first device 300 and/or the second device 400 from the external environment, reach the exhaust passage 200 and be exhausted, without flowing reversely, and maintain a certain flow rate, preferably a flow rate of 3 in/s. The exhaust passage 200 may also be provided with a partition plate in the middle, such that the exhaust passage 200 forms two chambers, one is communicated with the first device 300, the other is communicated with the second device 400, and one chamber that is communicated with the first device 300 and the second device 400 may also be formed.

Specifically, the first device 300 includes a closed container 320. The closed container 320 is located at one end, far from the exhaust passage 200, of the lower surface of the edge of the lens 100. The closed container 320 is a sector-ring gas curtain cavity and substantially includes two sector-ring surfaces arranged from top to bottom, an inner side arc surface and an outer side arc surface arranged in a radial direction, and two end surfaces connected with the sector-ring surfaces and inner/outer side arc surfaces. The inner side radius of the closed container 320 (i.e., the radius corresponding to the inner side arc surface) matches the radius of the lens 100, and is preferably the same as the radius of the lens 100, the outer side radius (i.e., the radius corresponding to the outer side arc surface) is required to not affect the assembly relationship of the object lens and/or other devices, and preferably is 2-3 cm greater than the radius of the lens 100. The arc length of the inner side arc surface is between $\frac{1}{2}$ circumference and $\frac{1}{4}$ of circumference of the lens 100, preferably the arc length of the inner side arc surface is $\frac{1}{3}$ of the circumference of the lens 100. The inner side arc surface of the closed container 320 is placed in close contact with the outer side surface of the edge of the lens 100, and the radial direction of the closed container 320 is overlapped with the radial direction of the lens 100.

As illustrated in FIG. 2, in the lens anti-contamination device disclosed by the present embodiment, the closed container 320 is provided with a gas inlet 310 and a nozzle 330. The gas inlet 310 is approximately located at the center point of the outer side arc surface of the closed container 320, and is a cylinder perpendicular to the outer side arc surface. One end of the gas inlet 310 is connected with a device that produces gas, and the gas inlet 310 may also be in other shapes such as cuboids perpendicular to the outer side arc surface. The nozzle 330 is evenly distributed on the surface of the inner side arc surface of the closed container 320 and consists of a plurality of small holes. The shape of the nozzle 330 may be selected to be different shapes such as circle or square under different conditions of use, and in the present embodiment, it can be seen that the small holes are circular small holes. In addition, the number of small holes of the nozzle 330 may be selected according to the need; the distance between the small holes may be uniform such that the protective layer gas can be uniformly distributed on the surface of the lens 100, or it may be not uniform. For example, because the gas flow path in the middle is longer, the distance between the small holes in the middle is smaller, and the distance between the small holes in both sides is larger, such that the protective layer gas flow in the middle is stronger. The small holes may be arranged in a row or in a plurality of rows, mainly depending on the number of the small holes and the height of the inner side arc surface of the closed container 320 (the distance extending along the axis of the lens). Due to the suction and exhaust power of the exhaust passage 200, the protective layer gas is sucked from the gas inlet 310, passes from the closed container 320, is output from the nozzle 330, flows through the lower surface of the lens 100 and then is exhausted along the exhaust passage 200.

As illustrated in FIGS. 3 and 4, the second device 400 includes an annular cavity 420. The inner diameter of the annular cavity 420 is not smaller than the diameter of the lens 100, it shall not block the lens 100 to influence exposure. The upper surface of the annular cavity 420 surrounds and is close to the edge of the lower surface of the lens 100 and the first device 300. The lower surface of the annular cavity 420 directly faces a silicon wafer 500.

In the lens anti-contamination device disclosed by the present embodiment, the lower surface of the annular cavity 420 is provided with a plurality of small holes 410. Further, the distance between the small holes 410 is equal. The small holes face a photoresist contamination source on the silicon wafer 500. The small holes may be in shapes such as circular shape and square shape. The number of the small holes may be selected according to the size of gas flow and the severity of contaminant volatilization. The distance between the small holes should be equal, such that the suction strength of the gas around the contamination source is equal. The small holes may be arranged in a row or in a plurality rows, mainly depending on the required number of the smaller holes and the width of the annular cavity 420. Because of the suction and exhaust power of the exhaust passage 200, the organic matter gas volatilized from photoresist on the silicon wafer 500 directly opposite to the lower surface of the annular cavity 420 is sucked into the small holes 410, enters the annular cavity 420, then flows through the annular cavity 420, reaches the exhaust passage 200 directly, and is exhausted into the external environment far away from the lens 100.

Embodiment 2

Figure 5:
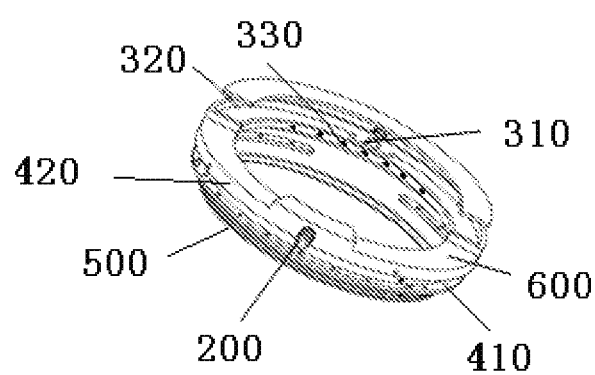
FIG. 5 is an exploded structural schematic view of a first device and a second device in embodiment 2 of the present invention.

As illustrated in FIG. 5 and FIG. 6, the main difference between embodiment 2 and embodiment 1 is that the first device 300 and the second device 400 may be integrally formed to form an integral body. For example, an integrated first and second device may be manufactured by forming convex containers respectively on the upper and lower surfaces of an annular partition plate 600 (preferably annular thin plate). The upper surface of the partition plate 600 can be used to form the closed container 320. The closed container 320 is sector-ring-shaped, and the arc length is about $\frac{1}{2}$ of the circumference of the partition plate 600. The value may be between the $\frac{1}{4}$ of the circumference and $\frac{1}{2}$ of the circumference of the partition plate 600. The inner diameter and outer diameter of the closed container 320 are equal to the inner diameter and outer diameter of the partition plate 600. The lower surface of the partition plate 600 can be used to form the annular cavity 420. The annular cavity 420 is whole-ring-shaped, the inner and outer diameters are equal to those of the partition plate 600.

In the present embodiment, the shapes, position relationship and functions of the exhaust passage 200, the gas inlet 310, the small holes 410 and the nozzle 330, as well as the path, direction, aerodynamic force and generation mode of the gas passage are the same as or similar to those of the previous embodiment, which will be not described in detail in the present embodiment. For details, refer to the description in the previous embodiment.

To sum up, the different configurations of the lens 100 anti-contamination device are described in detail in the above-mentioned embodiments. Of course, the present invention includes but is not limited to the configurations listed in the above-mentioned embodiments. Any content transformed on the basis of the configurations provided in the above-mentioned embodiments belongs to the scope protected by the present invention. One skilled in the art may draw inferences from the contents of the above-mentioned embodiments.

Embodiment 3

The present invention further provides a lens anti-contamination method, including the following steps:

step 1: outputting protective layer gas from a position close to the lower surface of a lens, a gas curtain protective layer being formed on the surface of the lens; and step 2: sucking the protective layer gas and/or contamination gas from a position close a contamination source, and exhausting the gas into an environment far away from the lens.

Further, in step 1, the output of the protective layer gas is continuously performed before and after exposure of the lithography machine.

Further, in step 2, the suction and exhaust of the protective layer gas and/or the contamination gas are continuously performed during and after exposure of the lithography machine.

The contamination gas suction and exhaust passage is closed 12 hours after the exposure of the lithography machine to reduce cost and energy consumption. The protective layer gas may be continuously supplied to form a continuous protective layer, such that other contaminants and impurities in the air can be prevented from contaminating the lens 100.

Herein, the protective layer gas flow passage takes the first device 300 and the exhaust passage 200 as the passage, and the path direction is from the gas inlet 310, to the closed container 320, to the nozzle 330, to the lower surface of the lens 100, to the exhaust passage 200 and then to the external environment. The contamination gas suction and exhaust passage takes the second device 400 and the exhaust passage 200 as the passage, and the path direction is from the small holes 410, to the annular chamber 420, to the exhaust passage 200 and then to the external environment. The protective layer gas is gas with purity up to or higher than 99.999%.

The above-mentioned description is only description of preferred embodiments of the present invention, instead of limitation to the scope of the present invention. Any variation or modification made by one skilled in the art according to the above disclosed contents belongs to the protection scope of the claims.

What is claimed is:

1. An anti-contamination device for a lens, comprising a first device and a second device connected to the first device, the first device being closer to the lens relative to the second device, wherein the first device is configured to output a protective layer gas to form a gas curtain protective layer on a surface of the lens;

the second device is configured to suck and exhaust the protective layer gas and/or a contamination gas;

the second device comprises an annular cavity; and a lower surface of the annular cavity is provided with a plurality of holes.

2. The anti-contamination device for a lens according to claim 1, further comprising an exhaust passage, wherein the first device and the second device are each connected to the exhaust passage.

3. The anti-contamination device for a lens according to claim 2, wherein the exhaust passage is connected with a suction and exhaust power.

4. The anti-contamination device for a lens according to claim 1, wherein the protective layer gas is a gas with a purity up to or higher than 99.999%.

5. The anti-contamination device for a lens according to claim 1, wherein the first device comprises a closed container.

6. The anti-contamination device for a lens according to claim 5, wherein the closed container is provided with a gas inlet and a nozzle, and wherein the protective layer gas enters the closed container through the gas inlet and is output through the nozzle.

7. The anti-contamination device for a lens according to claim 1, wherein distances between the plurality of small holes are equal.

8. An anti-contamination method for a lens, using the anti-contamination device for a lens according to claim 1, comprising:

step 1: outputting, by a first device, a protective layer gas from a position close to a lower surface of the lens, such that a gas curtain protective layer is formed on a surface of the lens; and step 2: sucking, by a second device, the protective layer gas and/or a contamination gas from a position close to a contamination source, and exhausting the protective layer gas and/or the contamination gas into an environment away from the lens.

9. The anti-contamination method for a lens according to claim 8, wherein the lens is a lens of a lithography machine, and in step 1, the output of the protective layer gas is continuously performed before and after exposure of the lithography machine.

10. The anti-contamination method for a lens according to claim 8, wherein the lens is a lens of a lithography machine, and in step 2, the suction and exhaust of the protective layer gas and/or the contamination gas are continuously performed during and after exposure of the lithography machine.

* * * * *